United States Patent
Wu et al.

(10) Patent No.: US 10,714,702 B2
(45) Date of Patent: Jul. 14, 2020

(54) ORGANIC LIGHT EMITTING DIODE HAVING CONNECTING LAYER INCLUDING MATERIAL CORRESPONDING TO CARRIERS IN CARRIER TRANSPORT LAYER

(71) Applicant: BOE TECHNOLOGY GROUP CO., LTD., Beijing (CN)

(72) Inventors: Changyen Wu, Beijing (CN); Juanjuan You, Beijing (CN); Yingying Song, Beijing (CN); Guang Yan, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 73 days.

(21) Appl. No.: 15/569,100

(22) PCT Filed: May 12, 2017

(86) PCT No.: PCT/CN2017/084155
§ 371 (c)(1),
(2) Date: Oct. 25, 2017

(87) PCT Pub. No.: WO2018/000969
PCT Pub. Date: Jan. 4, 2018

(65) Prior Publication Data
US 2018/0226602 A1 Aug. 9, 2018

(30) Foreign Application Priority Data
Jul. 1, 2016 (CN) .......................... 2016 1 0515760

(51) Int. Cl.
*H01L 51/50* (2006.01)
*H01L 51/56* (2006.01)
(Continued)

(52) U.S. Cl.
CPC .......... *H01L 51/5064* (2013.01); *H01L 27/32* (2013.01); *H01L 27/3211* (2013.01);
(Continued)

(58) Field of Classification Search
CPC ............. H01L 51/5064; H01L 51/5016; H01L 51/5044; H01L 51/508; H01L 27/32; H01L 27/3211
See application file for complete search history.

(56) References Cited

U.S. PATENT DOCUMENTS 8,558,224 B2    10/2013    Sawabe et al.
9,024,521 B2     5/2015    Yoshinaga et al.
(Continued)

FOREIGN PATENT DOCUMENTS

CN         1378409 A       11/2002
CN       102655164 A        9/2012
(Continued)

OTHER PUBLICATIONS

First Office Action dated May 27, 2017 in corresponding Chinese Patent Application No. 201610515760.5.
(Continued)

*Primary Examiner* — Matthew E. Gordon
(74) *Attorney, Agent, or Firm* — Nath, Goldberg & Meyer; Joshua B. Goldberg

(57) ABSTRACT

The present disclosure provides an organic light emitting diode (OLED) and a manufacturing method of the same, and a display device. The OLED comprises a first portion and a second portion which are manufactured by different processes and sequentially stacked, wherein the first portion comprises a first carrier transport layer, a first light emitting layer, and a connecting layer between the first light emitting layer and the second portion, which are sequentially stacked, the second portion comprises a second carrier transport
(Continued)

layer, the first light emitting layer comprises an N-type base material and a P-type base material, and the connecting layer comprises a material corresponding to carriers in the first carrier transport layer. The OLED provided by the present disclosure can not only make light emission stable, maintain a good efficiency of light emission, but obtain light with an ideal color and prevent a phenomenon of "unexpected emission of light".

11 Claims, 4 Drawing Sheets

(51) Int. Cl.
 H01L 27/32 (2006.01)
 H01L 51/52 (2006.01)
(52) U.S. Cl.
 CPC ........ *H01L 51/508* (2013.01); *H01L 51/5016* (2013.01); *H01L 51/5044* (2013.01); *H01L 51/5206* (2013.01); *H01L 51/5221* (2013.01); *H01L 51/56* (2013.01)

(56) References Cited

U.S. PATENT DOCUMENTS

| | | |
|---|---|---|
| 9,088,001 B2 | 7/2015 | Kim et al. |
| 9,130,185 B2 | 9/2015 | Lin |
| 9,269,920 B2 | 2/2016 | Yamazaki et al. |
| 9,412,976 B2 | 8/2016 | Wu |
| 9,608,224 B2 | 3/2017 | Seo et al. |
| 2012/0223633 A1* | 9/2012 | Yoshinaga .......... H01L 27/3211 313/504 |
| 2012/0241725 A1* | 9/2012 | Sawabe ............... H01L 51/5044 257/40 |
| 2015/0108456 A1 | 4/2015 | Shin et al. |
| 2015/0162559 A1* | 6/2015 | Wu ........................ H01L 51/56 257/40 |
| 2015/0188074 A1 | 7/2015 | Heo et al. |
| 2015/0318509 A1 | 11/2015 | Song et al. |
| 2017/0040561 A1 | 2/2017 | Wu et al. |

FOREIGN PATENT DOCUMENTS

| | | |
|---|---|---|
| CN | 102694127 A | 9/2012 |
| CN | 103518268 A | 1/2014 |
| CN | 103682116 A | 3/2014 |
| CN | 103730585 A | 4/2014 |
| CN | 103887435 A | 6/2014 |
| CN | 104576950 A | 4/2015 |
| CN | 104681580 A | 6/2015 |
| CN | 104752625 A | 7/2015 |
| CN | 105185917 A | 12/2015 |
| CN | 105895821 A | 8/2016 |

OTHER PUBLICATIONS

International Search Report dated Aug. 2, 2017 in corresponding International Application No. PCT/CN2017/084155 along with an English translation of the International Search Report and an English translation of the Written Opinion of the International Searching Authority.

* cited by examiner

ORGANIC LIGHT EMITTING DIODE HAVING CONNECTING LAYER INCLUDING MATERIAL CORRESPONDING TO CARRIERS IN CARRIER TRANSPORT LAYER

This is a National Phase Application filed under 35 U.S.C. 371 as a national stage of PCT/CN2017/084155, filed May 12, 2017, an application claiming the benefit of Chinese Application No. 201610515760.5, filed Jul. 1, 2016, the content of each of which is hereby incorporated by reference in its entirety.

TECHNICAL FIELD

The present disclosure relates to the field of display technology, and in particular relates to an organic light emitting diode (OLED), a manufacturing method of the OLED and a display device including the OLED.

BACKGROUND

An OLED includes an anode layer, a hole injection layer, a hole transport layer, a light emitting layer, an electron transport layer, an electron injection layer and a cathode layer.

In the prior art, an OLED including multiple layers is typically manufactured by using different processes. For example, a cathode layer, an electron injection layer, an electron transport layer and a light emitting layer may be formed using a vacuum evaporation method, while a hole transport layer and a hole injection layer may be formed using a solution method. In order to improve properties of an interface between two layers formed by different processes (for example, the light emitting layer and the hole transport layer), a connecting layer may also be formed between the two layers by an evaporation process. However, in such an OLED, the existence of the connecting layer may cause difficulties in balancing carriers during emission of light. Thus, in a case where the connecting layer is too thin, light emitting efficiency is reduced since carriers are quenched, and in a case where the connecting layer is too thick, a phenomenon of "unexpected emission of light" is likely to occur, that is, the OLED emits light of an undesired color (as shown in FIG. 5).

SUMMARY

Eliminating the above-described phenomenon of "unexpected emission of light" while maintaining a good light emitting efficiency, has become an urgent problem to be solved in the art.

It is an object of the present disclosure to provide an OLED, a manufacturing method of the OLED and a display device including the OLED capable of solving the above technical problem.

As an aspect of the present disclosure, an OLED includes a first portion and a second portion which are manufactured by different processes and sequentially stacked, wherein the first portion may include a first carrier transport layer, a first light emitting layer, and a connecting layer between the first light emitting layer and the second portion, which are sequentially stacked, the second portion may include a second carrier transport layer, the first light emitting layer may include an N-type base material and a P-type base material, and the connecting layer may include a material corresponding to carriers in the first carrier transport layer.

According to an embodiment of the present disclosure, the second portion may further include a second light emitting layer and a third light emitting layer provided between the connecting layer and the second carrier transport layer.

According to an embodiment of the present disclosure, the second light emitting layer and the third light emitting layer may be arranged side by side.

According to an embodiment of the present disclosure, a thickness of the connecting layer may range from 1 nm to 5 nm.

According to an embodiment of the present disclosure, the thickness of the connecting layer may range from 2 nm to 3 nm.

According to an embodiment of the present disclosure, the first light emitting layer may be a blue light emitting layer.

According to an embodiment of the present disclosure, the carriers in the first carrier transport layer may be electrons, and the connecting layer may include a same material as the P-type base material.

According to an embodiment of the present disclosure, the carriers in the first carrier transport layer may be holes, and the connecting layer may include a same material as the N-type base material.

According to an embodiment of the present disclosure, a triplet energy level of the connecting layer may be greater than 2.1 eV.

According to an embodiment of the present disclosure, the first portion may be formed by vacuum evaporation method, and the second portion may be formed by solution method.

According to an embodiment of the present disclosure, the OLED may further include a first electrode and a second electrode, and the first electrode, the first portion, the second portion and the second electrode may be sequentially stacked.

As another aspect of the present disclosure, a manufacturing method of an OLED comprises:

providing a substrate;

forming a second portion on the substrate using a second process, the second portion comprising a second carrier transport layer; and forming a first portion on the second portion using a first process, the first portion comprising a connecting layer, a first light emitting layer and a first carrier transport layer sequentially stacked on the second portion, wherein the first light emitting layer comprises an N-type base material and a P-type base material, and the connecting layer comprises a material corresponding to carriers in the first carrier transport layer.

According to an embodiment of the present disclosure, the forming a second portion on the substrate using a second process may include:

forming the second carrier transport layer on the substrate using the second process; and forming a second light emitting layer and a third light emitting layer on the second carrier transport layer using the second process.

According to an embodiment of the present disclosure, the second light emitting layer and the third light emitting layer may be arranged side by side.

According to an embodiment of the present disclosure, a thickness of the connecting layer may range from 1 nm to 5 nm.

According to an embodiment of the present disclosure, a thickness of the connecting layer may range from 2 nm to 3 nm.

According to an embodiment of the present disclosure, the first light emitting layer may be a blue light emitting layer.

According to an embodiment of the present disclosure, the carriers in the first carrier transport layer may be electrons, and the connecting layer may include a same material as the P-type base material.

According to an embodiment of the present disclosure, the carriers in the first carrier transport layer may be holes, and the connecting layer may include a same material as the N-type base material.

According to an embodiment of the present disclosure, a triplet energy level of the connecting layer may be greater than 2.1 eV.

According to an embodiment of the present disclosure, the first process may include vacuum evaporation method, and the second process may include solution method.

According to an embodiment of the present disclosure, the providing a substrate may include:

providing a second base substrate; and forming a second electrode on the second base substrate, wherein the second portion may be formed on the second electrode, and the manufacturing method may further comprise:

forming a first electrode on the first carrier transport layer.

As another aspect of the present disclosure, a display device includes the OLED according to any embodiment of the present disclosure.

In the light emitting diode (LED) according to an embodiment of the present disclosure, since the connecting layer is provided, an interface between two adjacent layers obtained by different processes is located between the connecting layer and the second carrier transport layer, thereby preventing defects from occurring on the first light emitting layer and improving light emitting efficiency of the first light emitting layer.

In the LED according to an embodiment of the present disclosure, the connecting layer may be provided with a smaller thickness. The smaller the thickness of the connecting layer, the less the influence on a color of light emitted by the first light emitting layer. Therefore, by providing the connecting layer with a smaller thickness, influence on a color of light emitted by the first light emitting layer can be reduced, thereby preventing a phenomenon of "unexpected emission of light".

In the LED according to an embodiment of the present disclosure, since a carrier recombination region is close to the first electrode, the carriers in the OLED are not easily quenched, so that the OLED can emit light stably, maintaining a good efficiency of light emission.

It can be seen that the LED according to an embodiment of the present disclosure not only is capable of making light emission stable and maintaining a good efficiency of light emission, but also can obtain light with an ideal color and prevent the phenomenon of "unexpected emission of light".

BRIEF DESCRIPTION OF THE FIGURES

The accompanying drawings, which constitute a part of the specification, are provided for further understanding of the present disclosure, and for explaining the present disclosure along with the following detailed description, but not intended to limit the present disclosure, in which.

DETAILED DESCRIPTION

Specific implementations of the present disclosure will be described in detail below in conjunction with the accompanying drawings. It should be understood that the specific implementations described herein are merely intended for describing and interpreting, rather than limiting, the present disclosure.

Figure 1:
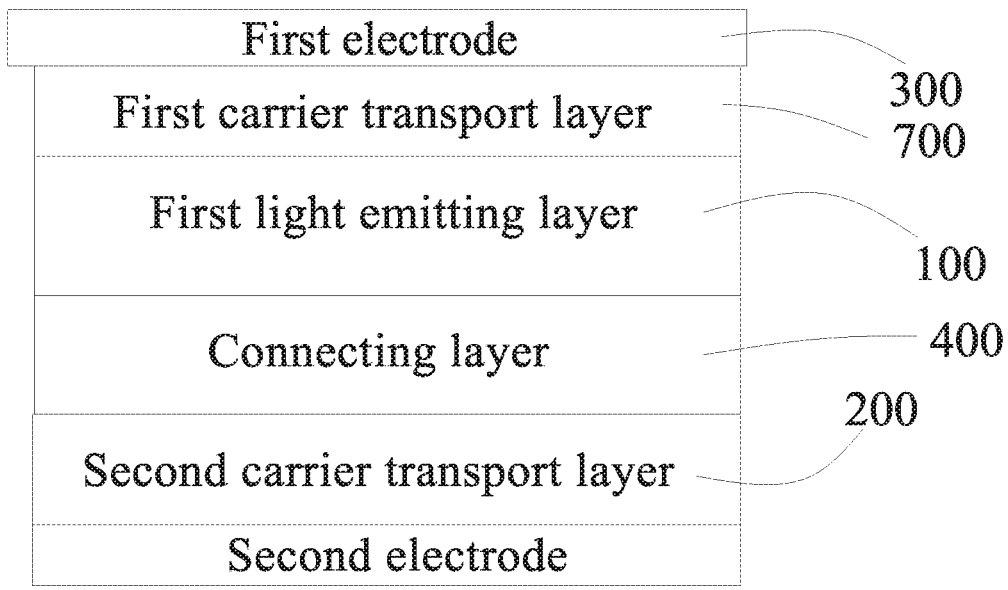
FIG. 1 is a schematic diagram of an exemplary structure of an OLED according to an embodiment of the present disclosure.

As shown in FIG. 1, an organic light emitting diode (OLED) according to an embodiment of the present disclosure may include a first portion and a second portion which are manufactured by different processes and sequentially stacked.

The first portion may include a first carrier transport layer 700 and, a first light emitting layer 100 which are sequentially stacked, and a connecting layer 400 between the first light emitting layer 100 and the second portion, which are sequentially stacked. The second portion may include a second carrier transport layer 200. The first light emitting layer 100 may include an N-type base material and a P-type base material. The connecting layer includes a material corresponding to carriers in the first carrier transport layer. For example, in a case where carriers in the first carrier transport layer 700 are electrons, the connecting layer 400 may include a same material as the P-type base material of the first light emitting layer 100; and in a case where carriers in the first carrier transport layer 700 are holes, the connecting layer 400 may include a same material as the N-type base material of the first light emitting layer 100.

It should be understood by one skilled in the art that, carriers of one of the first carrier transport layer 700 and the second carrier transport layer 200 may be electrons, and carriers of the other may be holes.

As described above, the first portion and the second portion may be manufactured by different processes. Since materials prepared by different processes have different characteristics, there may be interface defects on an interface between two adjacent layers manufactured by different processes. According to an embodiment of the present disclosure, since the connecting layer 400 is provided, an interface between two adjacent layers obtained by different processes is located between the connecting layer 400 and the second carrier transport layer 200, thereby preventing defects from occurring on the first light emitting layer 100 and improving light emitting efficiency of the first light emitting layer 100.

Figure 2:
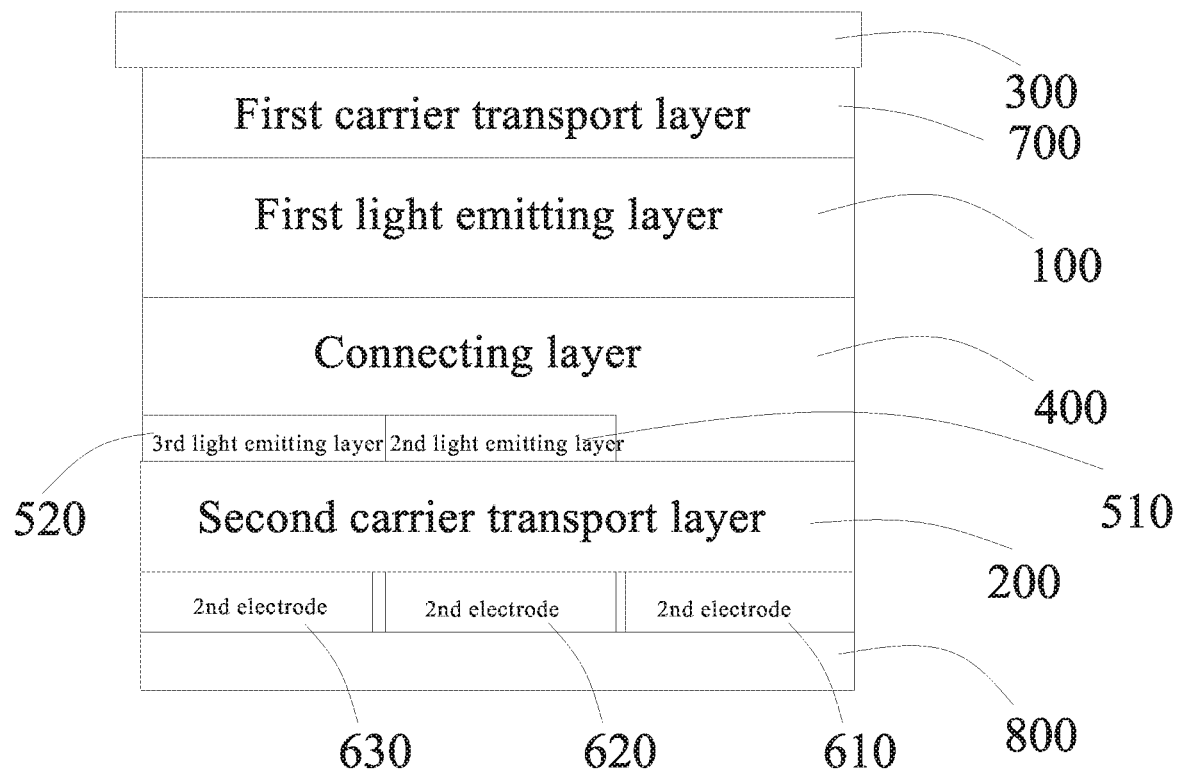
FIG. 2 is a schematic diagram of another exemplary structure of an OLED according to an embodiment of the present disclosure.
Figure 3A:
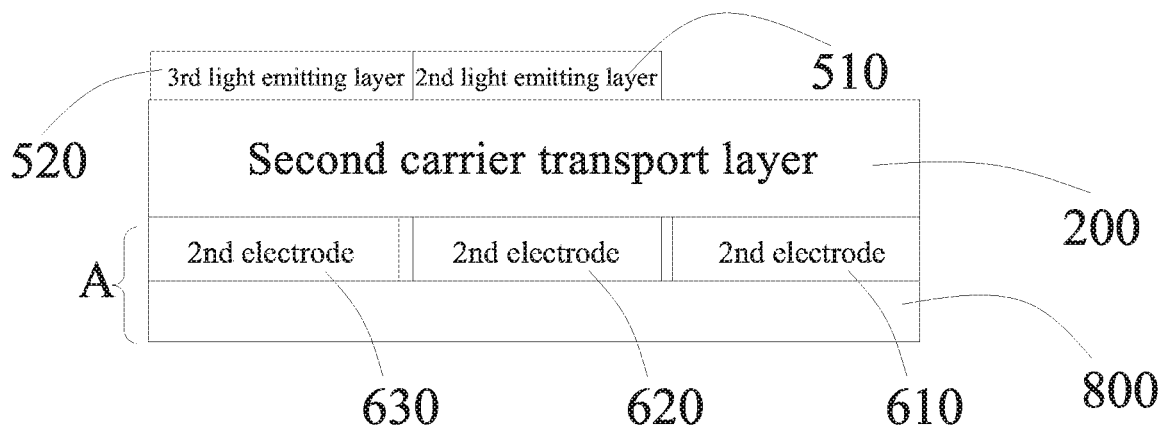
FIGS. 3(a) to 3(d) are diagrams illustrating a manufacturing method of an OLED according to an embodiment of the present disclosure.
Figure 3B:
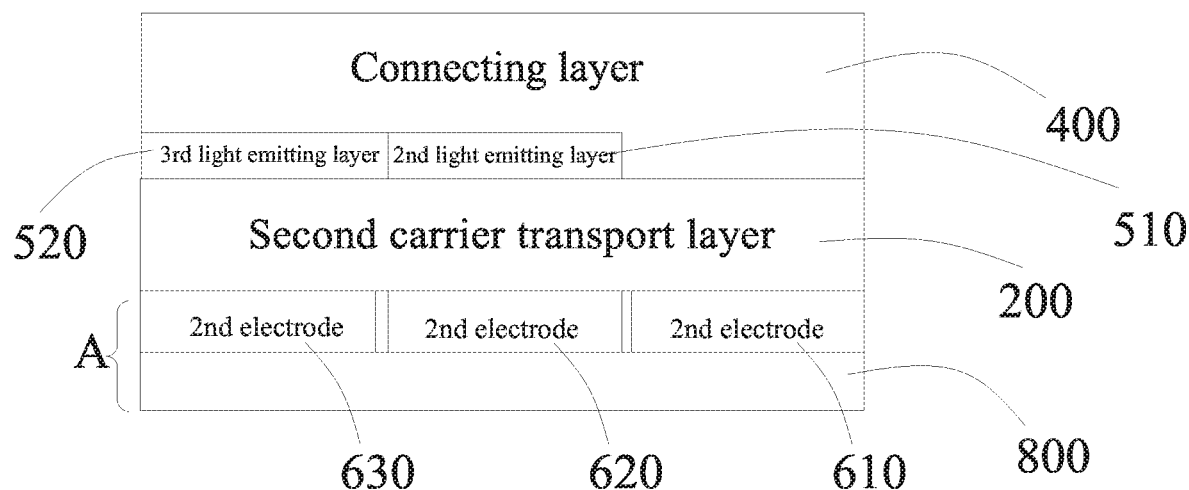
Figure 3C:
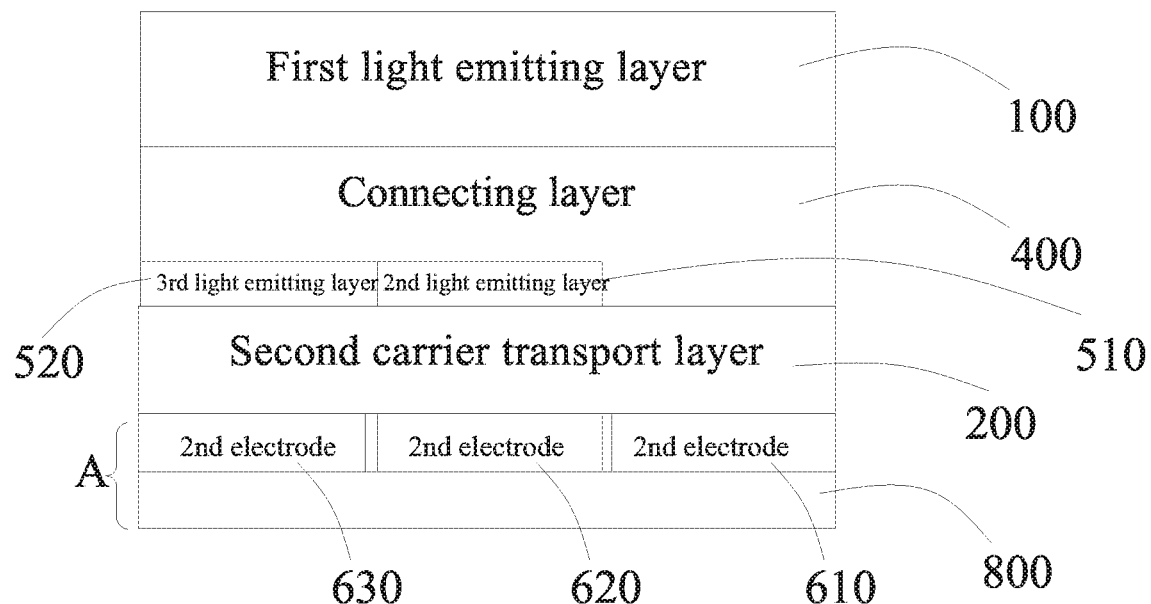
Figure 3D:
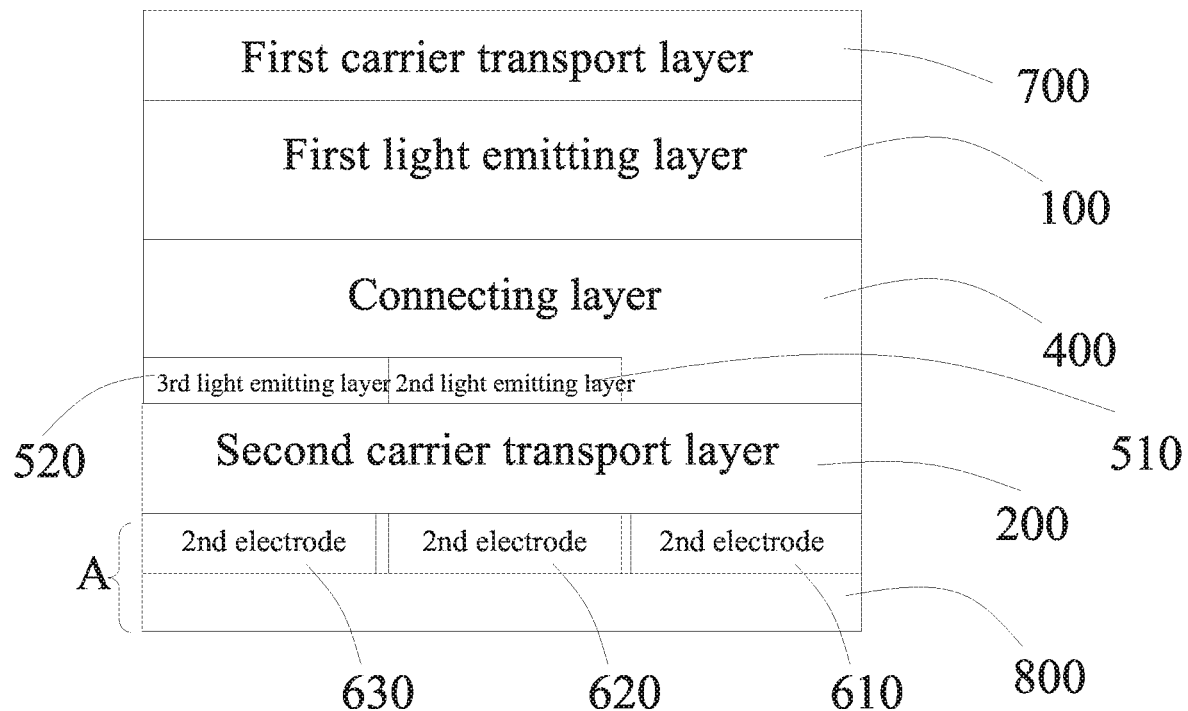
Figure 4:
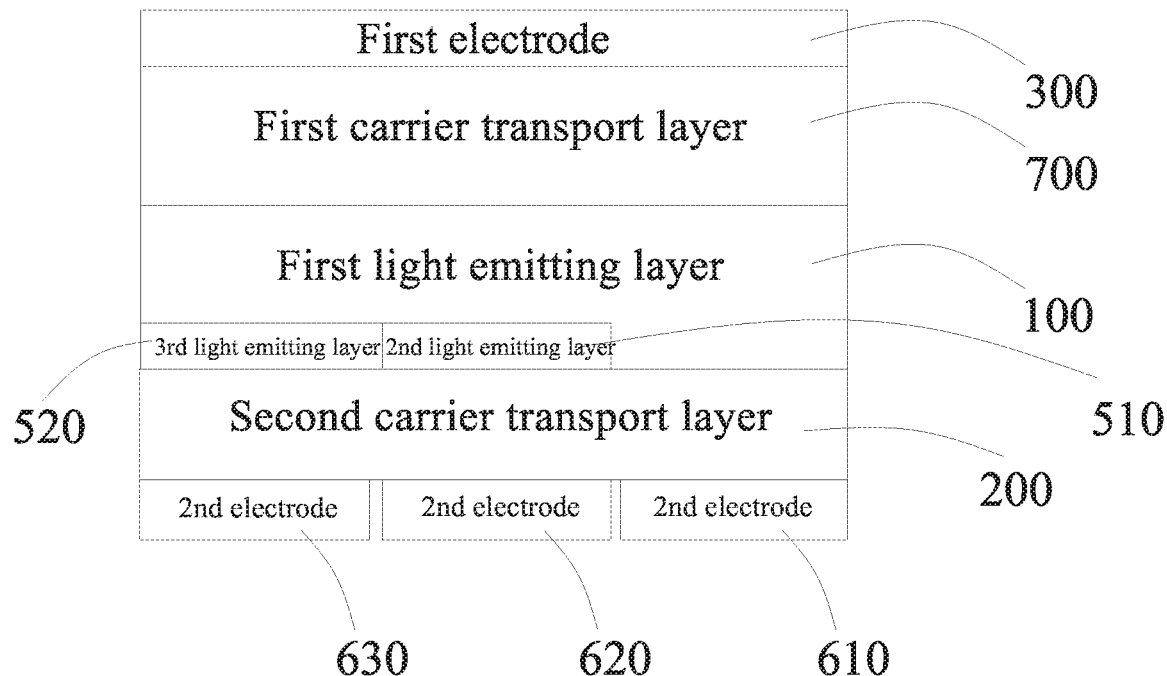
FIG. 4 is a schematic diagram of a structure of an OLED, in which a connecting layer is not provided.

For example, the following Table 1 illustrates performance parameters of a light emitting diode (LED) provided with a connecting layer and a LED without a connecting layer. A structure of the LED provided with a connecting layer is as shown in FIG. 2, and a structure of the LED without a connecting layer is as shown in FIG. 4. It can be seen from Table 1 that the LED provided with a connecting layer has a lower operation voltage and higher light flux per unit area and external quantum efficiency.

TABLE 1

| Structure | V | Cd/A | E.Q.E | CIEx | CIEy |
|---|---|---|---|---|---|
| without connecting layer | 3.6 | 4.7 | 4.9 | 0.143 | 0.107 |
| with connecting layer (thickness: 1 nm) | 3.42 | 5.3 | 6.3 | 0.145 | 0.088 |
| with connecting layer (thickness: 5 nm) | 3.46 | 5.9 | 6.9 | 0.144 | 0.089 | where
V denotes a voltage applied across an OLED;
Cd/A denotes light flux per unit area;
E.Q.E denotes external quantum efficiency;
CIEx denotes a color coordinate; and
CIEy denotes a color coordinate.

Figure 5:
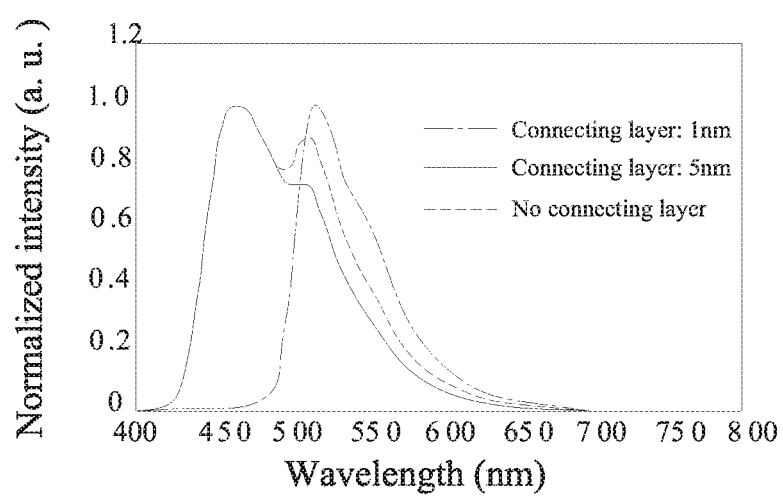
FIG. 5 illustrates normalized intensity of light emitted by three LEDs shown in Table 1.

However, in a case where a thickness of the connecting layer is large, the phenomenon of "unexpected emission of light" is likely to happen, that is, the LED emits light of an undesired color. For example, as shown in FIG. 5, a green LED with a connecting layer having a thickness of 5 nm may emit blue light.

In an embodiment of the present disclosure, the above problem is solved by determining a material of the connecting layer 400 according to type of carriers in the first carrier transport layer 700. In particular, the connecting layer includes a material corresponding to the carriers in the first carrier transport layer, for example, in a case where the carriers in the first carrier transport layer 700 are electrons, the connecting layer 400 may include a same material as the P-type base material of the first light emitting layer 100; and in a case where the carriers in the first carrier transport layer 700 are holes, the connecting layer 400 may include a same material as the N-type base material of the first light emitting layer 100. Thus, when the connecting layer 400 includes a same material as the P-type base material of the first light emitting layer 100, there may be more holes in the first light emitting layer 100; and when the connecting layer 400 includes a same material as the N-type base material of the first light emitting layer 100, there may be more electrons in the first light emitting layer 100.

When the carriers in the first carrier transport layer 700 are electrons, a first electrode 300 is a cathode, and the connecting layer 400 includes a same material as the P-type base material, so that there are more holes in the first light emitting layer 100, and that a carrier recombination region in the first light emitting layer 100 moves towards the first electrode 300. Because the carrier recombination region moves towards the first electrode 300, the connecting layer 400 may be provided with a smaller thickness. The smaller the thickness of the connecting layer 400, the less the influence on a color of light emitted by the first light emitting layer 100. Therefore, by providing the connecting layer 400 with a smaller thickness, influence on a color of light emitted by the first light emitting layer 100 can be reduced, thereby preventing a phenomenon of "unexpected emission of light".

Similarly, when the carriers in the first carrier transport layer 700 are holes, a first electrode 300 is an anode, and the connecting layer 400 includes a same material as the N-type base material, so that there are more electrons in the first light emitting layer 100, and that a carrier recombination region in the first light emitting layer 100 moves towards the first electrode 300. Because the carrier recombination region moves towards the first electrode 300, the connecting layer 400 may be provided with a smaller thickness. The smaller the thickness of the connecting layer 400, the less the influence on a color of light emitted by the first light emitting layer 100. Therefore, by providing the connecting layer 400 with a smaller thickness, influence on a color of light emitted by the first light emitting layer 100 can be reduced, thereby preventing a phenomenon of "unexpected emission of light".

In the LED according to an embodiment of the present disclosure, since the carrier recombination region is close to the first electrode 300, the carriers in the OLED are not easily quenched, so that the OLED can emit light stably, maintaining a good efficiency of light emission.

It can be seen that the LED according to an embodiment of the present disclosure not only is capable of making light emission stable and maintaining a good efficiency of light emission, but also can obtain light with an ideal color and prevent the phenomenon of "unexpected emission of light".

Referring to FIG. 1, the OLED may also include the first electrode 300 and a second electrode, which are located at both sides of the whole structure formed of the first portion and the second portion, respectively. In other words, the first electrode 300, the first portion, the second portion and the second electrode are stacked in sequence.

The OLED may also include a first base substrate and a second base substrate, the first electrode 300 being formed on the first base substrate, and the second electrode being formed on the second base substrate.

According to an embodiment of the present disclosure, as shown in FIG. 2, the second portion may also include a second light emitting layer 510 and a third light emitting layer 520 provided between the connecting layer 400 and the second carrier transport layer 200. The second light emitting layer 510 and the third light emitting layer 520 may emit light with a different color than that of light emitted by the first light emitting layer 100, respectively. Accordingly, the second electrode may include a second electrode 610, a second electrode 620 and a second electrode 630 corresponding to the first light emitting layer 100, the second light emitting layer 510 and the third light emitting layer 520, respectively.

In an embodiment shown in FIG. 2, the second light emitting layer 510 and the third light emitting layer 520 may be arranged side by side, such that different regions in the OLED may emit light with different colors, so as to be applicable to various display devices.

In an embodiment of the present disclosure, the first electrode 300 may be a cathode, and the second electrodes 610 to 630 may be anodes, but the present disclosure is not limited thereto.

According to an embodiment of the present disclosure, a triplet energy level of the connecting layer 400 may be greater than 2.1 eV. Such a connecting layer 400 may improve light emitting efficiency of the OLED.

As described above, the connecting layer 400 has a small thickness, for example, ranging from 1 nm to 5 nm, optionally, ranging from 2 nm to 3 nm.

According to an embodiment of the present disclosure, for example, the first portion (including the first carrier transport layer 700, the first light emitting layer 100 and the connecting layer 400) may be formed using vacuum evaporation method, and the second portion (including the second carrier transport layer 200, the second light emitting layer 510 and the third light emitting layer 520) may be formed using solution method, but the present disclosure is not limited thereto.

According to an embodiment of the present disclosure, the first light emitting layer 100 may be a blue light emitting layer, the second light emitting layer 510 may be a red light emitting layer, and the third light emitting layer 520 may be a green light emitting layer, but the present disclosure is not limited thereto.

As another aspect of the present disclosure, there is provided a manufacturing method of an OLED, including:
providing a substrate A;
forming a second portion on the substrate A using a second process, the second portion including a second carrier transport layer 200, as shown in FIG. 3(*a*);
forming a first portion on the second portion using a first process, the first portion including a connecting layer 400 (as shown in FIG. 3(*b*)), a first light emitting layer 100 (as shown in FIG. 3(*c*)) and a first carrier transport layer 700 (as shown in FIG. 3(*d*)) sequentially stacked on the second portion, wherein the first light emitting layer 100 includes an N-type base material and a P-type base material, and the connecting layer includes a material corresponding to carriers in the first carrier transport layer. For example, when the carriers in the first carrier transport layer 700 are electrons, the connecting layer 400 includes a same material as the P-type base material of the first light emitting layer 100, and when the carriers in the first carrier transport layer 700 are holes, the connecting layer 400 includes a same material as the N-type base material of the first light emitting layer 100. It is to be understood that carriers of one of the first carrier transport layer 700 and the second carrier transport layer 200 are electrons, and carriers of the other are holes.

In an embodiment of the present disclosure, the substrate A may include a second base substrate 800 and a second electrode provided on the second base substrate 800.

For example, optionally, as shown in FIG. 3(*a*), the providing the substrate A may include:
providing the second base substrate 800; and
forming the second electrode on the second base substrate 800.

In order to facilitate controlling a color of light emitted by an LED as necessary, according to an embodiment of the present disclosure, the forming the second portion on the substrate A using a second process may include:
forming a second carrier transport layer 200 on the substrate A using the second process;
forming a second light emitting layer 510 and a third light emitting layer 520 on the second carrier transport layer 200 using the second process, as shown in FIG. 3(*a*).

As shown in FIG. 3(*c*), a second light emitting layer 510 for emitting red light and a third light emitting layer 520 for emitting green light may be formed, respectively.

As described above, the first light emitting layer 100 may be a blue light emitting layer for emitting blue light.

As shown in FIG. 3(*a*), the second electrode may include a second electrode 610, a second electrode 620 and a second electrode 630, the first light emitting layer 100 corresponding to the second electrode 610, the second light emitting layer 510 corresponding to the second electrode 620, and the third light emitting layer 520 corresponding to the second electrode 630.

According to an embodiment of the present disclosure, the second electrode may be formed by an evaporation process.

According to an embodiment of the present disclosure, the second light emitting layer 510 and the third light emitting layer 520 may be arranged side by side.

According to an embodiment of the present disclosure, the first process may include vacuum evaporation method, and the second process may include solution method, but the present disclosure is not limited thereto.

According to an embodiment of the present disclosure, a triplet energy level of the connecting layer 400 may be greater than 2.1 eV.

According to an embodiment of the present disclosure, a thickness of the connecting layer 400 may range from 1 nm to 5 nm. Further optionally, a thickness of the connecting layer 400 may range from 2 nm to 3 nm.

According to an embodiment of the present disclosure, the manufacturing method may also include forming a first electrode on the first carrier transport layer.

According to an embodiment of the present disclosure, the manufacturing method may also include performing packaging using a first base substrate.

As described above, an LED manufactured using the manufacturing method of an LED according to an embodiment of the present disclosure not only is capable of making light emission stable and maintaining a good efficiency of light emission, but also can obtain light with an ideal color and prevent the phenomenon of "unexpected emission of light".

As yet another aspect of the person disclosure, there is provided a display device, including the OLED according to an embodiment of the present disclosure.

It can be understood that the foregoing implementations are merely exemplary implementations used for describing the principle of the present disclosure, but the present disclosure is not limited thereto. Those of ordinary skill in the art may make various variations and modifications without departing from the spirit and essence of the present disclosure, and these variations and modifications shall fall into the protection scope of the present disclosure

The invention claimed is:

1. An organic light emitting diode (OLED), comprising a first portion and a second portion which are manufactured by different processes and sequentially stacked, wherein
the first portion comprises a first carrier transport layer, a first light emitting layer, and a connecting layer between the first light emitting layer and the second portion, which are sequentially stacked, wherein
the second portion comprises a second carrier transport layer,
the first light emitting layer comprises an N-type base material and a P-type base material, and
the connecting layer comprises a material corresponding to carriers in the first carrier transport layer,
wherein a thickness of the connecting layer ranges from 2 nm to 3 nm, so as to avoid a phenomenon of unexpected emission of light, and
the first portion is formed by vacuum evaporation method, the second portion is formed by solution method, and an interface between the first portion and the second portion is located between the connecting layer and the second carrier transport layer.

2. The OLED according to claim 1, wherein the second portion further comprises a second light emitting layer and a third light emitting layer provided between the connecting layer and the second carrier transport layer.

3. The OLED according to claim 2, wherein the second light emitting layer and the third light emitting layer are arranged side by side.

4. The OLED according to claim 1, wherein a triplet energy level of the connecting layer is greater than 2.1 eV.

5. The OLED according to claim 1, further comprising a first electrode and a second electrode, wherein the first electrode, the first portion, the second portion and the second electrode are sequentially stacked.

6. A display device, comprising the OLED according to claim 1.

7. A manufacturing method of an organic light emitting diode (OLED), comprising:
providing a substrate;
forming a second portion on the substrate using a second process, the second portion comprising a second carrier transport layer; and
forming a first portion on the second portion using a first process, the first portion comprising a connecting layer, a first light emitting layer and a first carrier transport layer sequentially stacked on the second portion, wherein the first process comprises vacuum evaporation method, and the second process comprises solution method wherein
the first light emitting layer comprises an N-type base material and a P-type base material, and
the connecting layer comprises a material corresponding to carriers in the first carrier transport layer,
wherein the first light emitting layer is a blue light emitting layer, and
the carriers in the first carrier transport layer are holes, and the connecting layer comprises a same material as the N-type base material,
wherein a thickness of the connecting layer ranges from 2 nm to 3 nm so as to avoid a phenomenon of unexpected emission of light.

8. The manufacturing method according to claim 7, wherein the forming a second portion on the substrate using a second process comprises:
forming the second carrier transport layer on the substrate using the second process;
forming a second light emitting layer and a third light emitting layer on the second carrier transport layer using the second process.

9. The manufacturing method according to claim 8, wherein the second light emitting layer and the third light emitting layer are arranged side by side.

10. The manufacturing method according to claim 7, wherein a triplet energy level of the connecting layer is greater than 2.1 eV.

11. The manufacturing method according to claim 7, wherein the providing a substrate comprises:
providing a second base substrate; and
forming a second electrode on the second base substrate, wherein the second portion is formed on the second electrode, and
the manufacturing method further comprises:
forming a first electrode on the first carrier transport layer.

* * * * *